(12) United States Patent
Ouchi (10) Patent No.: US 9,584,079 B2
(45) Date of Patent: Feb. 28, 2017

(54) OPERATIONAL AMPLIFIER

(71) Applicant: NATIONAL INSTITUTE OF ADVANCED INDUSTRIAL SCIENCE AND TECHNOLOGY, Tokyo (JP)

(72) Inventor: Shinichi Ouchi, Ibaraki (JP)

(73) Assignee: NATIONAL INSTITUTE OF ADVANCED INDUSTRIAL SCIENCE AND TECHNOLOGY, Tokyo (JP)

( * ) Notice: Subject to any disclaimer, the term of this patent is extended or adjusted under 35 U.S.C. 154(b) by 6 days.

(21) Appl. No.: 14/648,775

(22) PCT Filed: Dec. 3, 2013

(86) PCT No.: PCT/JP2013/082408
§ 371 (c)(1),
(2) Date: Jun. 1, 2015

(87) PCT Pub. No.: WO2014/087980
PCT Pub. Date: Jun. 12, 2014

(65) Prior Publication Data
US 2015/0357979 A1 Dec. 10, 2015

(30) Foreign Application Priority Data
Dec. 4, 2012 (JP) ................. 2012-265457

(51) Int. Cl.
*H03F 3/393* (2006.01)
*H03F 3/45* (2006.01)
*H03F 3/00* (2006.01)

(52) U.S. Cl.
CPC ......... *H03F 3/393* (2013.01); *H03F 3/45179* (2013.01); *H03F 3/45192* (2013.01);
(Continued)

(58) Field of Classification Search
CPC .... H03F 3/45; H03F 3/45192; H03F 3/45475; H03F 3/393; H03F 3/45179;
(Continued)

(56) References Cited

U.S. PATENT DOCUMENTS 4,048,574 A * 9/1977 Barbier .................... H03F 3/38
330/9
5,206,602 A 4/1993 Baumgartner et al.
(Continued)

FOREIGN PATENT DOCUMENTS

JP 6-224659 8/1994
JP 2006-511125 A 3/2006
(Continued)

OTHER PUBLICATIONS

R. Hogervorst; J.P. Tero, R. G.H. Eschauzier and J.H. Huijsing; "A Compact Power-Efficient 3 V CMOS Rail-To-Rail Input/Output Operational Amplifier for VLSI Cell Libraries", IEEE Journal of Solid-State Circuits, vol. 29, No. 12, pp. 1505-1513, Dec. 1994.

*Primary Examiner* — Khanh V Nguyen
(74) *Attorney, Agent, or Firm* — Bacon & Thomas, PLLC (57) ABSTRACT

There is provided an operational amplifier which is operable as well when an operating voltage decreases without creating a range where a circuit would not operate or reducing circuit gain. High-pass filters 102-105 provide output signals therefrom to bias-set input nodes of differential amplifiers Gm1-Gm4 to a potential within a common-mode range in which the respective differential amplifiers Gm1-Gm4 are operable. In this manner, the respective differential amplifiers Gm1-Gm4 can be operated effectively regardless of the possible decrease in a supply voltage, enabling normal amplifying operation. In addition, reduction in gain due to the reduced operational voltage is avoided. Therefore, it is preferably applicable to the application where digital and analog circuits are loaded together on the same IC chip.

(Continued)

When a high-pass filter is required at each input side of two- or more-stage differential amplifiers, a phase compensation method utilizing multiple paths is provided for a lower range of a phase margin created at the low frequency side, enabling normal amplitude operation.

6 Claims, 6 Drawing Sheets

(52) U.S. Cl.
CPC ......... *H03F 3/45475* (2013.01); *H03F 3/005* (2013.01); *H03F 2200/168* (2013.01); *H03F 2200/249* (2013.01); *H03F 2200/271* (2013.01); *H03F 2200/405* (2013.01); *H03F 2203/45366* (2013.01); *H03F 2203/45512* (2013.01); *H03F 2203/45544* (2013.01); *H03F 2203/7212* (2013.01)

(58) Field of Classification Search
CPC ..... H03F 2200/405; H03F 2203/45366; H03F 2203/45512; H03F 2200/271; H03F 2200/168; H03F 2203/45544
USPC ............................................................ 330/9
See application file for complete search history.

(56) References Cited

U.S. PATENT DOCUMENTS

| | | | |
|---|---|---|---|
| 6,621,334 B2 * | 9/2003 | Ausserlechner | H03F 3/38 330/9 |
| 7,385,443 B1 | 6/2008 | Denison | |
| 7,456,684 B2 * | 11/2008 | Fang | H03F 1/26 330/9 |
| 7,795,960 B2 * | 9/2010 | Lyden | H03F 3/387 330/9 |
| 2006/0055456 A1 | 3/2006 | Niederkorn | |
| 2008/0180278 A1 | 7/2008 | Denison | |
| 2009/0115522 A1 | 5/2009 | Lyden et al. | |

FOREIGN PATENT DOCUMENTS

| | | |
|---|---|---|
| JP | 2010-517472 A | 5/2010 |
| JP | 2010-539793 A | 12/2010 |

* cited by examiner

OPERATIONAL AMPLIFIER

BACKGROUND OF THE INVENTION

1. Field of the Invention

The present invention relates to an operational amplifier, and in particular, to a chopper-stabilized operational amplifier in which input signal pairs are modulated by a first chopper to be amplified in a signal processing path configured by one or more differential amplifier stages, and the amplified modulated signals are demodulated by a second chopper for output.

2. Description of the Related Art

There is an advantage in creating an analog circuit and a digital circuit on the same integrated circuit (IC) chip in terms of reduction in the cost of a system. However, implementing the digital and analog circuits together on the same IC chip adds the constraints imparted to the analog circuit design. One of such constraints is decrease in an operating voltage range resulting from supply voltage scaling. In other words, when supply voltage scaling is necessary to scale down the device size in digital circuits, an input voltage range of the analog circuit would be significantly limited without reducing a threshold voltage.

As one of the traditional techniques for solving this problem, the folded-cascode operational amplifiers have been widely known conventionally (e.g., see Non-Patent Document 1). This type of operational amplifier has a circuit configuration in which, as shown in the circuit diagram of FIG. 7, a first differential pair including PMOS transistors M2a and M2b as input transistors whose sources are connected commonly to a high supply voltage $V_{DD}$ via a source and drain of a PMOS transistor M1, and a second differential pair including NMOS transistors M3a and M3b as input transistors whose sources are connected commonly to a low supply voltage $V_{SS}$ via a source and drain of an NMOS transistor M4 are used complementarily.

Figure 7:
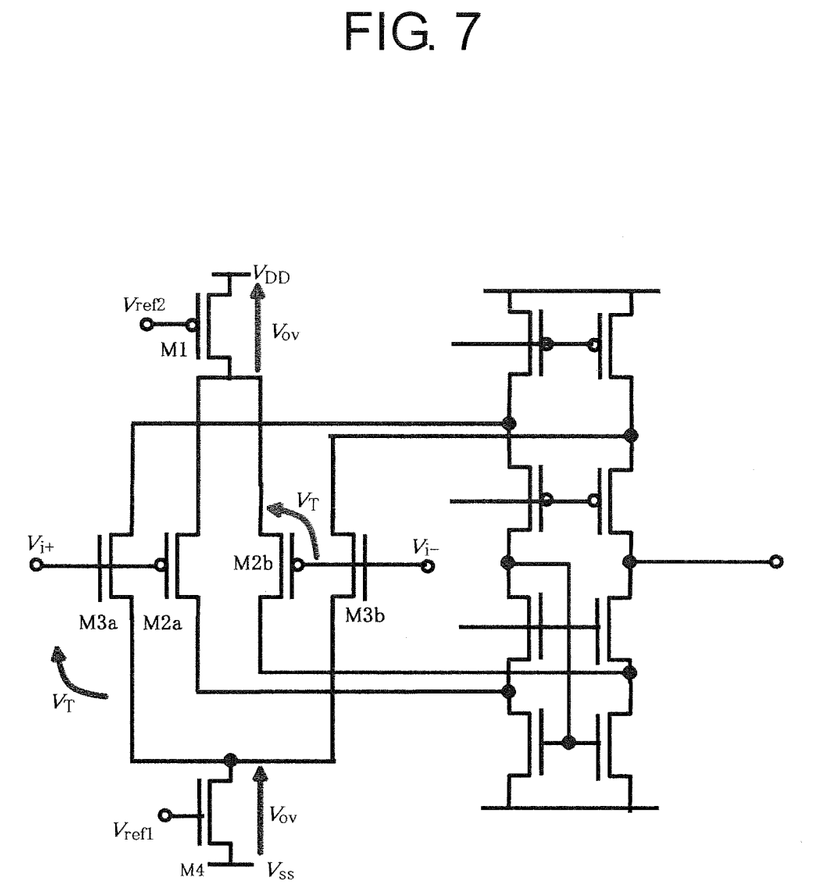
FIG. 7 is a diagram illustrating a circuit example of an input stage of a conventional operational amplifier.

This conventional operational amplifier operates effectively under the condition that satisfies:

$$V_{DD} - V_{SS} > |V_{T,m2}| + V_{ov,m1} + V_{T,m3} + V_{ov,m4} \quad (1)$$

where, in Formula (1), $V_{T,m2}$ denotes a threshold voltage of the PMOS transistors M2a and M2b, $V_{T,m3}$ denotes a threshold voltage of the NMOS transistors M3a and M3b, $V_{ov,m1}$ denotes a gate overdrive voltage of the PMOS transistor M1, and $V_{ov,m4}$ denotes a gate overdrive voltage of the NMOS transistor M4.

Non-Patent Document 1: Ron Hogervorst, John P. Tero, Ruud G. H. Eschauzier, and Johan H. Huijsing, "A compact power-efficient 3 V CMOS rail-to-rail input/output operational amplifier for VLSI cell libraries", IEEE Journal of Solid-State Circuits, Vol. 29, No. 12, pp. 1505-1513, December 1994.

SUMMARY OF THE INVENTION

However, in the conventional operational amplifier described above, when an operational voltage ($V_{DD}-V_{SS}$), or a difference between the high supply voltage and the low supply voltage, further decreases, the circuit ceases to operate within the following input voltage range:

$$V_{DD} - (|V_{T,m2}| + V_{ov,m1}) < V_{i,cm} < V_{SS} + V_{T,m3} + V_{ov,m4} \quad (2)$$

where, in Formula (2), $V_{i,cm}$ denotes a common-mode input voltage ($=V_{i+}+V_{i-})/2$) of the differential amplifier. There is also a problem that, in the conventional operational amplifier described above, when the operational voltage ($V_{DD}-V_{SS}$) decreases, the circuit gain would absolutely decrease.

In view of the circumstances described above, the present invention is directed to provide an operational amplifier which is operable as well when the operating voltage decreases without creating a range where the circuit would not operate or reducing the circuit gain.

In order to achieve the objects described above, an operational amplifier of a first aspect of the invention is characterized by including: a first chopper for modulating an input signal pair; a first signal processing path on a stage subsequent to the first chopper, having at least one circuit unit set or multiple circuit unit sets connected in series, the circuit unit set being constituted by one high-pass filter and one differential amplifier to amplify output signals from the high-pass filter, wherein output nodes of the high-pass filter of each set are biased to a potential within a common-mode range that enables operation of the differential amplifier of that circuit unit set; and a second chopper for signal demodulation provided on the output side of the first signal processing path.

Also, in order to achieve the objects described above, the operational amplifier of a second aspect of the invention is characterized by including, in addition to the first aspect of the invention: a first phase-compensating signal path to provide feedback from a first node to a second node in a signal path from the output nodes of the differential amplifier of the first circuit unit set, that receive signals output from the first chopper as input signals, in the first signal processing path to the second chopper, wherein the first phase-compensating signal path includes: a first phase-compensating capacitive element; a third chopper for signal demodulation connected between the first node at a feedback source and one node of the first phase-compensating capacitive element; and a fourth chopper for signal modulation connected between the other node of the first phase-compensating capacitive element and the second node at a feedback destination.

Also, in order to achieve the objects described above, the operational amplifier of a third aspect of the invention is characterized by including, in addition to the first or second aspect of the invention: a second phase-compensating signal path to provide feedback from a node at a feedback source after the second chopper to a node at a feedback destination in the first signal processing path, wherein the second phase-compensating signal path includes: a second phase-compensating capacitive element with one node being connected to the node at the feedback source; and a fifth chopper for signal modulation connected between the other node of the second phase-compensating capacitive element and the node at the feedback destination.

Also, in order to achieve the objects described above, the operational amplifier of a fourth aspect of the invention is characterized by including, in any one of the first to third aspects of the invention: a second signal processing path including one differential amplifier connected to the output nodes of the first chopper; a summing means for summing an output signal from the first signal processing path and an output signal from the second signal processing path; and an amplifier that amplifies the signal generated by the summing means and supplied via the second chopper and outputs the amplified signal as an output signal of the operational amplifier.

Also, in order to achieve the objects described above, the operational amplifier of a fifth aspect of the invention is characterized in that wherein the first signal processing path of the fourth aspect of the invention is constituted by multiple circuit unit sets, and wherein at a frequency corresponding to the second highest cutoff frequency among cutoff frequencies of the respective high-pass filters each included in the multiple circuit unit sets, gain of the second signal processing path is set equal to or higher than gain of the first signal processing path.

Also, in order to achieve the objects described above, the operational amplifier of a sixth aspect of the invention is characterized in that wherein the differential amplifier constituting the second signal processing path is provided with a high-pass filter on the input side.

Also, in order to achieve the objects described above, the operational amplifier of a seventh aspect of the invention is characterized by including, in the first to third aspects of the invention: third and fourth signal paths each equivalent to a circuit unit including the first signal processing path, the second signal processing path including one differential amplifier connected to the output nodes of the first chopper, and the summing means for summing the output signal from the first signal processing path and the output signal from the second signal processing path; a class-AB amplifier for inverted output and a class-AB amplifier for non-inverted output, each being constituted by a push-pull configuration with a first conduction type transistor and a second conduction type transistor; and a switch means to provide non-inverted signals output from the third and fourth signal processing paths to the first and second conduction type transistors of the class-AB amplifier for inverted output, respectively, and to provide inverted signals output from the third and fourth signal processing paths to the first and second conduction type transistors of the class-AB amplifier for non-inverted output, respectively.

According to the present invention, by providing a high-pass filter on the input side of a differential amplifier that amplifies an input signal pair modulated by a chopper, and setting the bias point of the differential-amplifier input node within a common-mode range in which the differential amplifier is operable, the differential amplifier can be operated effectively regardless of the possible decrease in a supply voltage without decreasing gain, enabling normal amplifying operation.

DESCRIPTION OF EMBODIMENTS

Hereinafter, each embodiment of the present invention will be described with reference to the drawings.

First Embodiment

Figure 1:
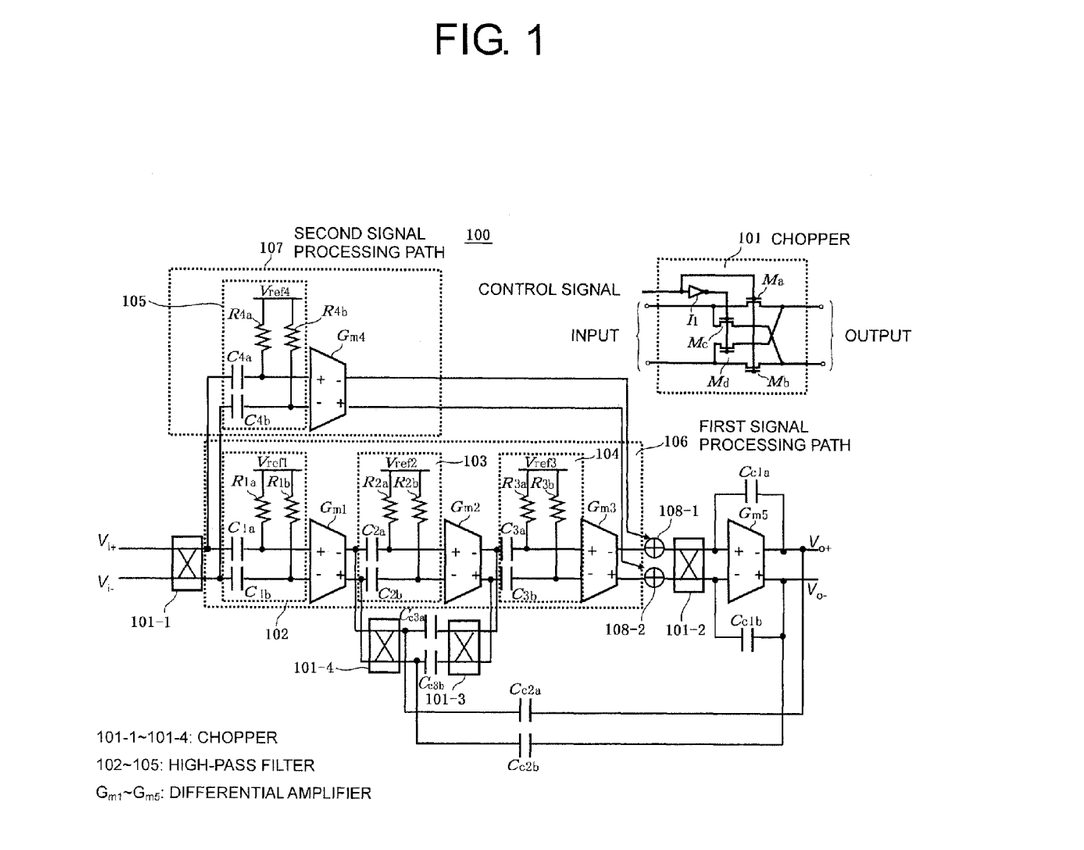
FIG. 1 is a circuit diagram illustrating a first embodiment of an operational amplifier according to the present invention.

FIG. 1 shows a circuit diagram illustrating a first embodiment of an operational amplifier according to the present invention. An operational amplifier 100 of this embodiment is a chopper-stabilized operational amplifier in which a non-inverting input terminal and an inverting input terminal are connected via a first chopper 101-1 to a first high-pass filter 102, a first differential amplifier Gm1, a second high-pass filter 103, a second differential amplifier Gm2, a third high-pass filter 104, and a third differential amplifier Gm3 in series in that order, and also connected via the first chopper 101-1 to a fourth high-pass filter 105 and a fourth differential amplifier Gm4 in series in that order. A series circuit including the high-pass filter 102, the differential amplifier Gm1, the high-pass filter 103, the differential amplifier Gm2, the high-pass filter 104, and the differential amplifier Gm3 configures a first signal processing path 106. Also, a series circuit including the high-pass filter 105 and the differential amplifier Gm4 configures a second signal processing path 107.

The high-pass filter 102 includes a capacitive element $C_{1a}$ and a resistance $R_{1a}$ as well as a capacitive element $C_{1b}$ and a resistance Rib to bias input nodes of the differential amplifier Gm1 with a reference voltage $V_{ref1}$ via the resistances $R_{1a}$ and $R_{1b}$. Also, the high-pass filter 103 includes a capacitive element $C_{2a}$ and a resistance $R_{2a}$ as well as a capacitive element $C_{2b}$ and a resistance $R_{2b}$ to bias input nodes of the differential amplifier Gm2 with a reference voltage $V_{ref2}$ via the resistances $R_{2a}$ and $R_{2b}$. Moreover, the high-pass filter 104 includes a capacitive element $C_{3a}$ and a resistance $R_{3a}$ as well as a capacitive element $C_{3b}$ and a resistance $R_{3b}$ to bias input nodes of the differential amplifier Gm3 with a reference voltage $V_{ref3}$ via the resistances $R_{3a}$ and $R_{3b}$. Similarly, the high-pass filter 105 includes a capacitive element $C_{4a}$ and a resistance $R_{4a}$ as well as a capacitive element Cob and a resistance $R_{4b}$ to bias input nodes of the differential amplifier Gm4 with a reference voltage $V_{ref4}$ via the resistances $R_{4a}$ and $R_{4b}$.

Here, the above-mentioned reference voltages $V_{ref1}$, $V_{ref2}$, $V_{ref3}$, and $V_{ref4}$ are set at a level above the lower limit of the input range in which the differential amplifiers Gm1, Gm2, Gm3, and Gm4 are operable, respectively. In other words, the outputs of the high-pass filters 102-105 bias the input nodes of the differential amplifiers Gm1, Gm2, Gm3, and Gm4 to a potential within a common-mode range that enables the operation of the differential amplifiers.

In addition, the inverting output terminal of the differential amplifier Gm3 and the inverting output terminal of the differential amplifier Gm4 are connected to a fifth differential amplifier Gm5 via a first summing element 108-1 and a second chopper 101-2, while the non-inverting output terminal of the differential amplifier Gm3 and the non-inverting output terminal of the differential amplifier Gm4 are connected to the fifth differential amplifier Gm5 via a second summing element 108-2 and the second chopper 101-2. Moreover, the phase-compensating capacitive elements $C_{c1a}$ and $C_{c1b}$ establish feedback loop from the inverting output terminal to the non-inverting input terminal and from the non-inverting output terminal to the inverting input terminal of the differential amplifier Gm5, respectively.

In addition, the output nodes (inverting and non-inverting output terminals) of the differential amplifier Gm2 are connected to phase-compensating capacitive elements $C_{c3a}$, $C_{c3b}$ via a third chopper 101-3, and further fed back to the output nodes (inverting and non-inverting output terminals) of the differential amplifier Gm1 via a fourth chopper 101-4. In other words, the phase-compensating capacitive elements $C_{c3a}$, $C_{c3b}$ make feedback loops for phase compensation through the third chopper 101-3 and the fourth chopper 101-4 between the two sets of nodes placed in a signal path from the output nodes of the differential amplifier Gm1, to which output signals of the first chopper 101-1 are supplied, to the second chopper 101-2.

Moreover, the inverting output terminal and the non-inverting output terminal of the differential amplifier Gm5 are connected to the non-inverting output terminal and the inverting output terminal of the operational amplifier 100, respectively, and also are fed back to a pair of connecting points between the fourth chopper 101-4 and the phase-compensating capacitive elements $C_{c3a}$, $C_{c3b}$ via the phase-compensating capacitive elements $C_{c2a}$, $C_{c2b}$. In other words, the feedback is established from the nodes on the stage subsequent to the second chopper 101-2, through the phase-compensating capacitive elements $C_{c2a}$, $C_{c2b}$ and the fourth chopper 101-4, to the output nodes of the differential amplifier Gm1.

Four choppers 101-1 to 101-4 have the same configuration, i.e., as well-known and shown as 101 in FIG. 1, for example, first and second input terminals are connected separately to first and second output terminals via drains and sources of MOS transistors Ma, Mb, respectively, while the first input terminal is connected to the second output terminal via a drain and source of a MOS transistor Mc and the second input terminal is connected to the first output terminal via a drain and source of a MOS transistor Md. Also, control pulses are applied to each gate of the two MOS transistors Ma and Mb, and to each gate of the remaining MOS transistors Mc and Md through an inverter 11.

Since these four MOS transistors Ma-Md are the same channel-type transistors, when the control pulses exhibit a symmetric square wave, first and second switch states are brought alternately at every half-cycle where, in the first switch state, the MOS transistors Ma, Mb turn on concurrently and the MOS transistors Mc, Md turn off concurrently, while in the second switch state, the MOS transistors Ma, Mb turn off concurrently and the MOS transistors Mc, Md turn on concurrently. Thereby, input signal pairs to be supplied to the chopper 101-1 are output with a frequency modulation. Also, from the chopper 101-2 to which the frequency-modulated signals are supplied, demodulated signals are extracted. Note that the four choppers 101-1 to 101-4 operate synchronously with each other.

In other words, the chopper 101-1 provided on the input side of the signal input nodes of the first signal processing path 106 is a chopper for signal modulation, and the chopper 101-2 provided after the last differential amplifier of the first signal processing path, Gm3, is a chopper for signal demodulation. Note that an input signal pair and for the first chopper 101-1 may be two AC signals with alternative polarities, or may be two DC signals with alternative polarities.

In addition, for the differential amplifier 100 of this embodiment, in the phase-compensating signal path subsidiary to the first signal processing path from the output nodes of the differential amplifier Gm1, to which the frequency-modulated signals by the first chopper 101-1 are supplied through the high-pass filter 102, to the second chopper 101-2, the third chopper 101-3 for signal demodulation is provided between the nodes at the feedback source of the phase-compensating signal path to one node on one side of the phase-compensating capacitive elements $C_{c3a}$, $C_{c3b}$, while the fourth chopper 101-4 for signal modulation is provided between the other node of the phase-compensating capacitive elements $C_{c3a}$, $C_{c3b}$ and the nodes at the feedback destination.

In addition, a fifth chopper is provided with the phase-compensating capacitive elements $C_{c2a}$, $C_{c2b}$ on the phase-compensating signal path that provides feedback from the nodes on the stage after the second chopper 101-2 to the nodes in the signal path from the first chopper 101-1 to the second chopper 101-2 (in this case, the output nodes of the differential amplifier Gm1). In the embodiment of FIG. 1, the fourth chopper 101-4 also serves the function of the fifth chopper.

Here, signal outputs from the first signal processing path 106 are phase-compensated suitably by summing with signals output from the second signal processing path 107 at the summing elements 108-1, 108-2. In other words, the lack of stability, resulting from the phase lead by 90 degrees or more introduced by the first signal processing path 106 including three differential amplifiers Gm1-Gm3, can be compensated with the output signals from the second signal processing path 107 including one differential amplifier Gm4.

Figure 2:
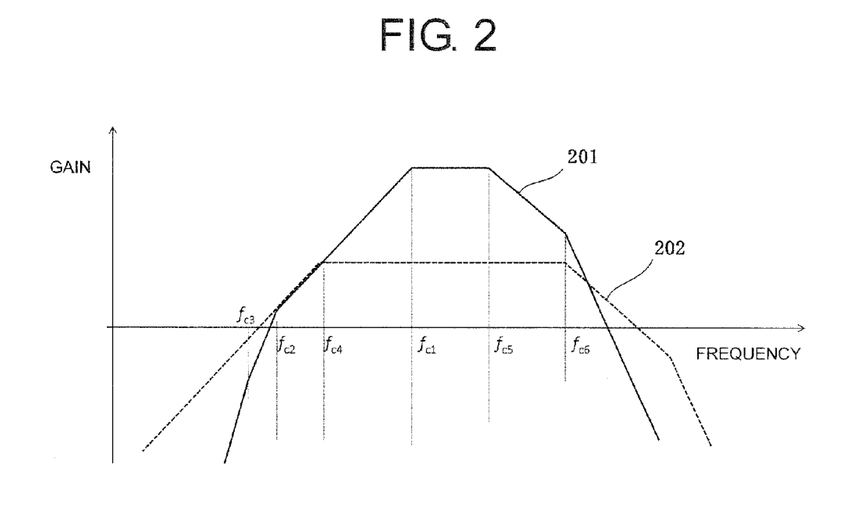
FIG. 2 is a diagram illustrating the relationship between a total gain and a signal frequency of a path from an input terminal through a first signal processing path 106 to an output terminal, and the relationship between a total gain and a signal frequency of a path from an input terminal through a second signal processing path 107 to an output terminal, wherein the paths do not include choppers and phase-compensating signal paths in FIG. 1.

This will be described with reference to FIG. 2 illustrating the frequency vs. gain characteristic. In FIG. 2, a solid line 201 denotes the relationship between total gain and frequencies of signals in the path from the input terminals through the first signal processing path 106 to the output terminals, while a dotted line 202 denotes the relationship between total gain and frequencies of signals in the path from the input terminals through the second signal processing path 107 to the output terminals, excluding the choppers 101-1 to 101-4 and the phase-compensating signal path having the phase-compensating capacitive elements $C_{c1a}$, $C_{c1b}$, $C_{c2a}$, $C_{c2b}$, $C_{c3a}$, and $C_{c3b}$.

In FIG. 2, the symbols $f_{c1}$, $f_{c2}$, $f_{c3}$, $f_{c4}$ denote cutoff frequencies of the high-pass filters 102, 103, 104, 105, respectively. These cutoff frequencies $f_{c1}$, $f_{c2}$, $f_{c3}$, $f_{c4}$ are set to a frequency that is equal to or less than the chopping frequency of the choppers 101-1 to 101-4. When the signal processing pass of the operational amplifier is consisting of only the above-mentioned first signal processing path 106 and feedback from the output terminals to the input terminals is performed with gain of 1, the phase lead of 120 degrees or more is introduced at low frequencies, resulting in oscillation. On the other hand, the signal processing path from the input terminals to the output terminals via the second signal processing path 107 only causes the phase lead of 90 degrees at most. For this reason, the phase lead can be limited to less than 120 degrees by setting the gain of the second signal processing path 107 to be equivalent to or higher than that of the first signal processing path 106 at the second highest cutoff frequency $f_{c2}$ among the cutoff frequencies $f_{c1}$, $f_{c2}$, $f_{c3}$ of the respective high-pass filters 102-104 included in the first signal processing path 106, and adding the output signals from the both paths 106 and 107.

In contrast, in FIG. 2, the symbols $f_{c5}$, $f_{c6}$ denote cutoff frequencies corresponding to the lowest and second lowest cutoff frequencies, respectively, among the cutoff frequencies to be generated in the signal paths through the above-mentioned signal processing paths 106 and 107 to the outputs, excluding phase-compensating feedback circuits.

By driving all the choppers 101-1 to 101-4 in such signal paths at the frequency lower than the lowest frequency $f_{c5}$ and equal to or higher than $f_{c1}$, more preferably at the frequency equal to or lower than $f_{c5}/3$, even more preferably at the frequency equal to or lower than $f_{c5}/5$, or equal to or lower than $f_{c5}/7$, and equal to or higher than $f_{c1}$, a base frequency, a third harmonic, a fifth harmonic, and up to a seventh harmonic generated by signal modulation with the first chopper 101-1 can be amplified to the maximum extent, and these amplified signals can be demodulated by the second chopper 101-2.

In addition, the operational amplifier 100 of this embodiment has an advantage in that, while the phase-compensating capacitive elements $C_{c2a}$, $C_{c2b}$, $C_{c3a}$, $C_{c3b}$ perform phase compensation by providing the choppers 101-3 and 101-4, signals modulated by the chopper 101-1 are processed without bandwidth limitation caused by the local phase-compensating signal path having the phase-compensating capacitive elements $C_{c2a}$, $C_{c2b}$, $C_{c3a}$, $C_{c3b}$, until they pass through the chopper 101-2. Although the similar effect can be achieved by implementing the choppers right before the respective high-pass filters 102-105 and right after the respective differential amplifiers Gm1-Gm4, it requires seven choppers. In contrast, this embodiment requires as few as four choppers with the configuration of FIG. 1.

Figure 3:
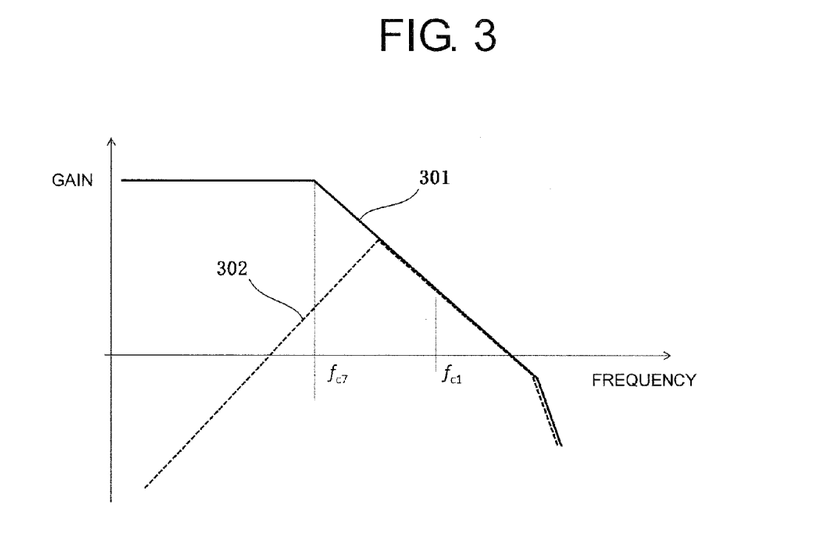
FIG. 3 is a diagram illustrating a frequency characteristic of a signal output through a second chopper in FIG. 1, and an open loop transfer function of the operational amplifier at an input of the second chopper.

In FIG. 3, a solid line 301 denotes a frequency characteristic of the signal output through the second chopper 101-2, and a dashed line 302 denotes an open loop transfer function of the operational amplifier 100 at the input of the second chopper 101-2. Adding (summing) the output signal from the first signal processing path 106 and the output signal from the second signal processing path 107 at the summing elements 108-1 and 108-2 ensures a sufficient phase margin if phase lead and phase delay are introduced at the low and high frequency sides. In addition, the choppers 101-1 to 101-4 serve for baseband components of the respective output signals to be amplified with sufficient gain and demodulated by the choppers on the subsequent stage, where the frequency characteristic of the signal output through the second chopper 101-2 is shown by the solid line 301 in FIG. 3.

When the symbol $f_{c7}$ denotes a cutoff frequency having the lowest frequency among those in the frequency characteristics of the whole operational amplifier, the appropriate design of the chopping frequency ($>f_{c1}$) of the choppers 101-1 to 101-4 and the phase-compensating capacitances to realize $f_{c7} \ll f_{c1}$ allows substantial suppression of a baseband noise.

In this manner, according to the operational amplifier 100 of this embodiment, since the output signals from the high-pass filters 102-105 are biased to a potential within the common-mode range in which the respective differential amplifiers Gm1-Gm4 are operable, and the signals are input to the input nodes of the differential amplifiers Gm1-Gm4, the respective differential amplifiers Gm1-Gm4 can be operated effectively regardless of the possible decrease in the supply voltage, enabling the normal amplifying operation. In addition, since the high-pass filters and the amplifiers can be connected in multistage, reduction in the gain due to the reduced operational voltage can be avoided with the multistage connection of the amplifiers. Therefore, it is preferably applicable to the application where digital and analog circuits are implemented together on the same IC chip.

In addition, according to the operational amplifier 100 of this embodiment, when a high-pass filter is required at input nodes of the two- or more-stage differential amplifiers, a phase compensation method utilizing multiple paths is provided to prevent the phase margin decrease in the low-frequency domain and enable normal amplification operation.

At this time, the baseband noise can be reduced efficiently not only at the first stage, but also at all the differential amplifiers existing between the modulating chopper 101-1 and the demodulating chopper 101-2. At the same time, the number of the choppers can be reduced. Reducing the number of the choppers reduces the clock field through created at the choppers.

First Variation of First Embodiment

Figure 4:
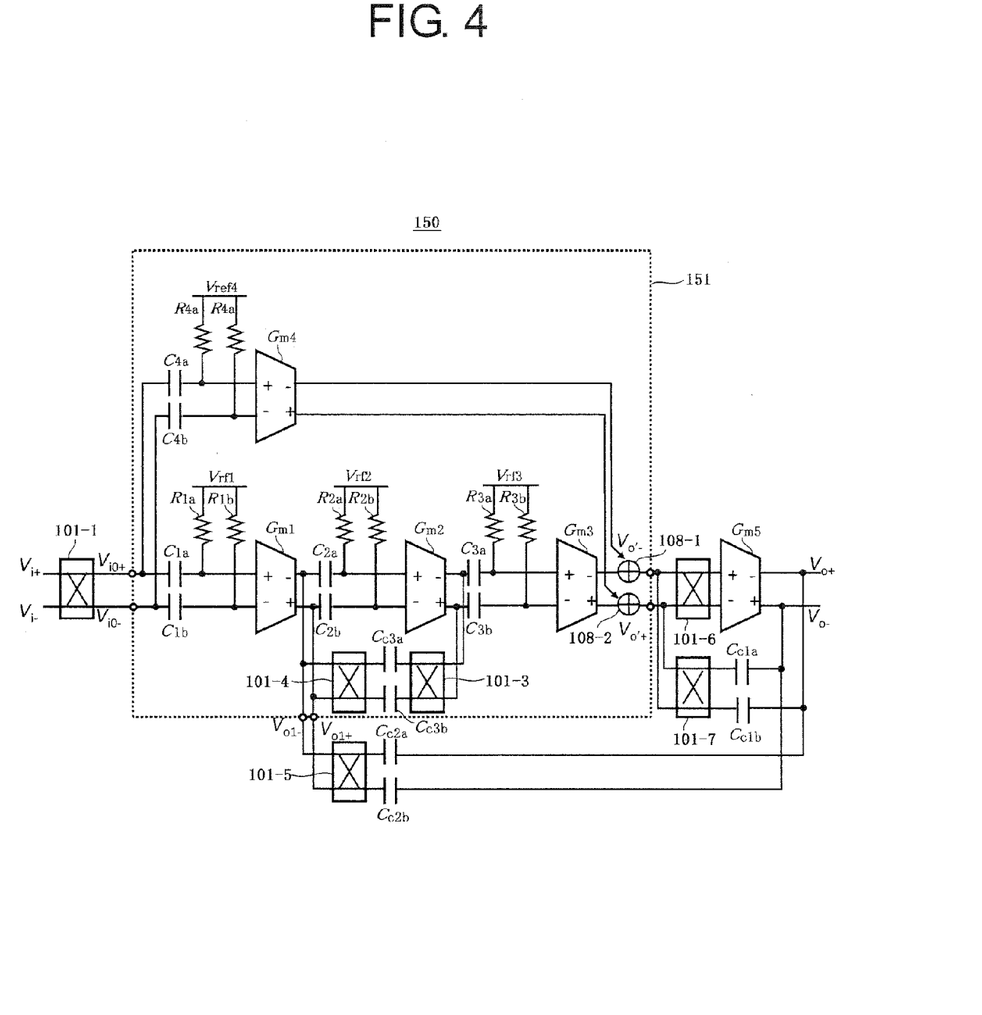
FIG. 4 is a circuit diagram illustrating a first variation of the first embodiment of the operational amplifier according to the present invention.

FIG. 4 shows the circuit diagram of a first variation of the first embodiment of the operational amplifier according to the present invention. In this figure, the same components as those in FIG. 1 are denoted by the same symbols, and the explanation thereof is omitted. An operational amplifier 150 in the variation of the first embodiment shown in FIG. 4 is configured by a circuit 151 including the first signal processing path 106, the second signal processing path 107, the choppers 101-3 and 101-4, and the summing elements 108-1 and 108-2 as shown in FIG. 1, along with choppers provided independently at the phase-compensating capacitive elements external to the circuit 151.

In other words, in the operational amplifier 150 shown in FIG. 4, the second chopper 101-2 in the embodiment in FIG. 1 is replaced by a sixth chopper 101-6 and a seventh chopper 101-7 in a feedback loop including the phase-compensating capacitive elements $C_{c1a}$, $C_{c1b}$ of the differential amplifier Gm5, and further the phase-compensating capacitive elements $C_{c2a}$, $C_{c2b}$ feed the output signals back to the connecting points of the output terminals of the differential amplifier Gm1 and the capacitive elements $C_{2a}$, $C_{2b}$. While, in the embodiment in FIG. 1, the phase-compensating capacitive elements $C_{c2a}$, $C_{c2b}$ are connected to the fourth chopper 101-4 so that the fourth chopper 101-4 also serves the function of the fifth chopper, the operational amplifier 150 is provided with the fifth chopper 101-5 independently.

In this operational amplifier 150, the choppers 101-5, 101-6, 101-7 are provided independently for the respective phase-compensating capacitive elements, so that it offers an advantage in that the ON-resistance of these choppers can be utilized as resistive components that prevent the instability caused by feed-forward loops.

Second Variation of First Embodiment

In the embodiment and its variation shown in FIGS. 1 and 4, the high-pass filter 103 can be omitted accordingly in such a case that the differential amplifier Gm2 receives the outputs from the differential amplifier Gm1 as they are.

Second Embodiment

Figure 5:
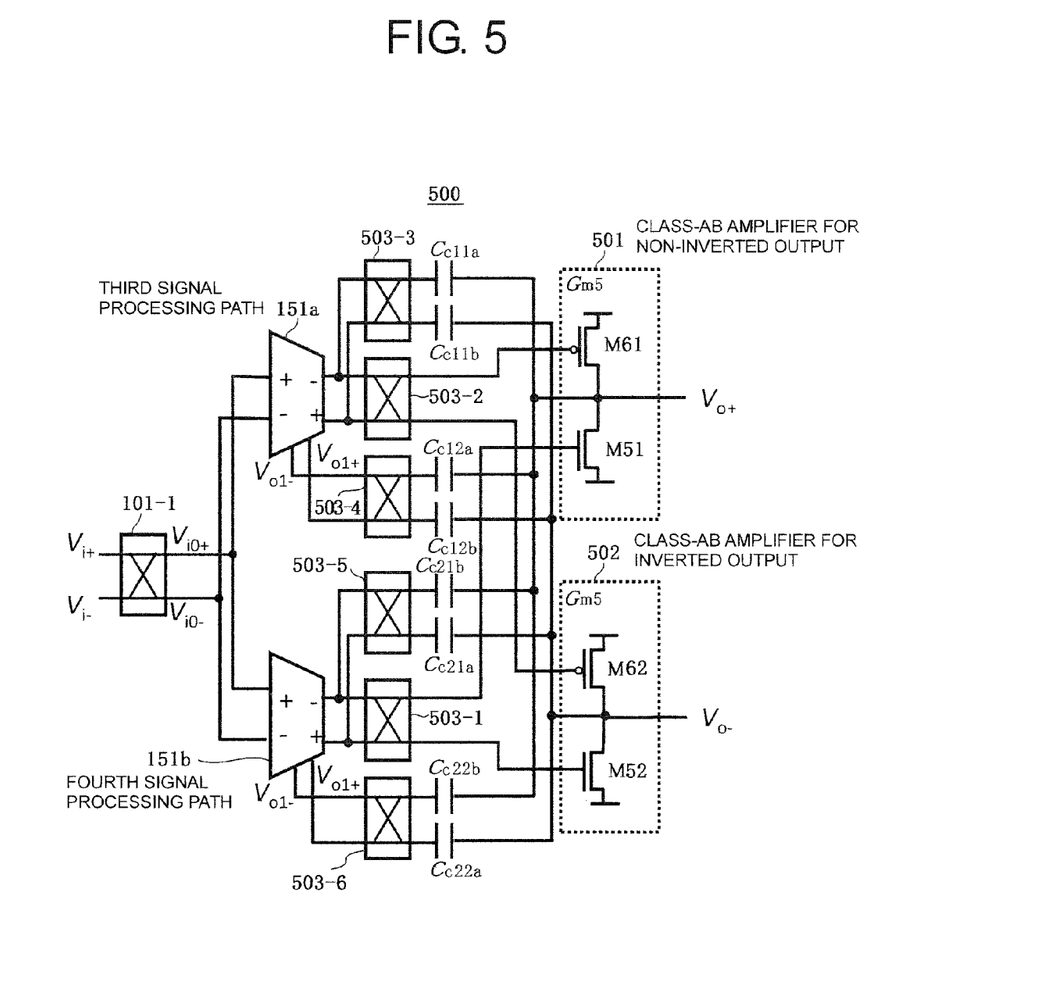
FIG. 5 is a circuit diagram illustrating a second embodiment of the operational amplifier according to the present invention.

FIG. 5 shows the circuit diagram of a second embodiment of the operational amplifier according to the present invention. In this figure, the same components as those in FIG. 4 are denoted by the same symbols. An operational amplifier 500 of the second embodiment shown in FIG. 5 is a chopper-stabilized operational amplifier operating as a fully differential amplifier by including two circuit units 151a and 151b equivalent to the circuit unit 151 enclosed by the dashed line in FIG. 4 to serve as third and fourth signal processing paths, respectively, providing a class-AB amplifier for non-inverted output 501 and a class-AB amplifier for inverted output 502, inputting inverted signals output from the respective third and fourth signal processing paths 151a, 151b to the class-AB amplifier for non-inverted output 501 through the choppers, and inputting non-inverted signals output from the respective third and fourth signal processing paths 151a, 151b to the class-AB amplifier for inverted output 502 through the choppers. The choppers 101-1 and 503-1 to 503-6 shown in FIG. 5 are synchronized with each other by a control circuit (not shown) to be controlled to the same switch state.

The class-AB amplifier for non-inverted output 501 is configured to have a push-pull function constituted by a first conduction type N-channel MOS transistor M51 and a second conduction type P-channel MOS transistor M61, while the class-AB amplifier for inverted output 502 is configured to have a push-pull function constituted by an N-channel MOS transistor M52 and a P-channel MOS transistor M62. The gate of the N-channel MOS transistor M51 constituting the class-AB amplifier for non-inverted output 501 is connected to an output node of a fourth signal processing path 151b via the chopper 503-1, while the gate of the P-channel MOS transistor M61 is connected to an output node of a third signal processing path 151a via the chopper 503-2. On the other hand, the gate of the N-channel MOS transistor M52 constituting the class-AB amplifier for inverted output 502 is connected to an output node of the fourth signal processing path 151b via the chopper 503-1, while the gate of the P-channel MOS transistor M62 is connected to an output node of the third signal processing path 151a via the chopper 503-2.

In addition, the output nodes of the third signal processing path 151a are connected to phase-compensating capacitive elements $C_{c12a}$, $C_{c12b}$ via the chopper 503-3 and phase-compensating capacitive elements $C_{c11a}$, $C_{c11b}$, while the output nodes of the fourth signal processing path 151b are connected to phase-compensating capacitive elements $C_{c12a}$, $C_{c12b}$ via the chopper 503-5 and phase-compensating capacitive elements $C_{c21a}$, $C_{c21b}$, and moreover, the phase-compensating capacitive elements $C_{c12a}$, $C_{c12b}$ are connected to feedback terminals $V_{o1-}$, $V_{o1+}$ of the third signal processing path 151a via the chopper 503-4. Similarly, the output nodes of the fourth signal processing path 151b are connected to phase-compensating capacitive elements $C_{c22a}$, $C_{c22b}$ via the chopper 503-5 and phase-compensating capacitive elements $C_{c21a}$, $C_{c21b}$, while the output nodes of the third signal processing path 151a are connected to the phase-compensating capacitive elements $C_{c22a}$, $C_{c22b}$ via the chopper 503-3 and the phase-compensating capacitive elements $C_{c11a}$, $C_{c11b}$, and moreover, the phase-compensating capacitive elements $C_{c22a}$, $C_{c22b}$ are connected to feedback terminals $V_{o1+}$, $V_{o1-}$ of the fourth signal processing path 151b via the chopper 503-6.

An output terminal for non-inverted output signals $V_{o+}$ connected with the connecting point of the MOS transistors M51 and M61 is connected to the phase-compensating capacitive elements $C_{c11a}$, $C_{c12a}$, $C_{c21b}$, $C_{c22b}$, while an output terminal for inverted output signals $V_{o-}$ connected with the connecting point of the MOS transistors M52 and M62 is connected to the phase-compensating capacitive elements $C_{c11b}$, $C_{c12b}$, $C_{c21a}$, $C_{c22a}$. Note that the choppers 503-1 to 503-6 constitute switching means according to the seventh aspect of the invention.

In the operational amplifier 500 of this embodiment configured as described above, when the choppers 101-1, 503-1 to 503-6 are in a first switch state where they each outputs the input signals for the first and second input terminals to the first and second output terminals, the non-inverted signals output from the third signal processing path 151a are applied to the gate of the P-channel MOS transistor M62 of the class-AB amplifier for inverted output 502 via the chopper 503-2, and the inverted signals output therefrom are applied to the gate of the P-channel MOS transistor M61 of the class-AB amplifier for non-inverted output 501 via the chopper 503-2. On the other hand, the non-inverted signals output from the fourth signal processing path 151b are applied to the gate of the N-channel MOS transistor M52 of the class-AB amplifier for inverted output 502 via the chopper 503-1, and the inverted signals output therefrom are applied to the gate of the N-channel MOS transistor M51 of the class-AB amplifier for non-inverted output 501 via the chopper 503-1.

Thereby, the non-inverted signals output from the third signal processing path 151a and the fourth signal processing path 151b are amplified and inverted by the class-AB amplifier for inverted output 502 to be output as inverted signals $V_{o-}$. At the same time, the inverted signals output from the third signal processing path 151a and the fourth signal processing path 151b are amplified and inverted by the class-AB amplifier for non-inverted output 501 to be output as non-inverted signals $V_{o+}$.

Here, the non-inverted output signals $V_{o+}$ are fed back to the third signal processing path 151a via the phase-compensating capacitive elements $C_{c11a}$, $C_{c12a}$ and the choppers 503-3, 503-4, and fed back to the fourth signal processing path 151b via the phase-compensating capacitive elements $C_{c21b}$, $C_{c22b}$. On the other hand, the inverted output signals $V_{o-}$ are fed back to the third signal processing path 151a via the phase-compensating capacitive elements $C_{c11b}$, $C_{c12b}$ and the choppers 503-3, 503-4, and fed back to the fourth signal processing path 151b via the phase-compensating capacitive elements $C_{c21a}$, $C_{c22a}$.

In this manner, for the non-inverted output signals and the inverted output signals obtained from the third and fourth signal processing paths 151a, 151b through the amplification process, the inverted output signals are further amplified by the class-AB amplifier 501 to be output as the non-inverted output signals $V_{o+}$ of the whole amplifier, while the non-inverted output signals are further amplified by the class-AB amplifier 502 to be output as the inverted output signals $V_{o-}$ of the whole amplifier. Thereby, this operational amplifier 500 allows the output amplitude of the non-inverted output signals $V_{o+}$ and the inverted output signals $V_{o-}$ to extend closely to the range between the high voltage source $V_{DD}$ and the low voltage source $V_{SS}$.

Here, when the choppers 101-1, 503-1 to 503-6 are switched to a second switch state where they each outputs the input signals for the first and second input terminals to the second and first output terminals, the input signals to the class-AB amplifier for non-inverted output 501 and the class-AB amplifier for inverted output 502 for the input signal pair are switched to the opposite of the above-described first switch state, and then the operation similar to that described above is carried out.

Third Embodiment

Figure 6:
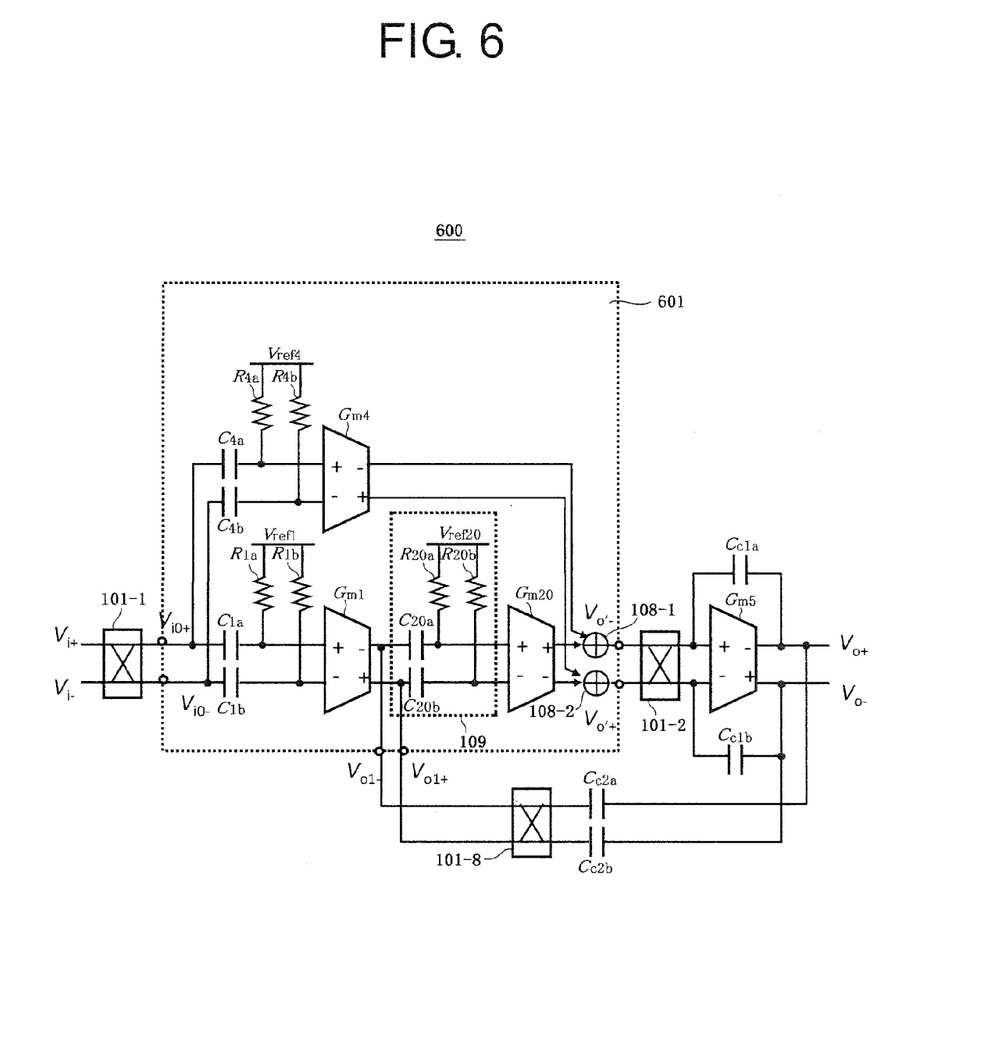
FIG. 6 is a circuit diagram illustrating a third embodiment of the operational amplifier according to the present invention.

FIG. 6 shows the circuit diagram of a third embodiment of the operational amplifier according to the present invention. In this figure, the same components as those in FIG. 1 are denoted by the same symbols, and the explanation thereof is omitted. An operational amplifier 600 of the third embodiment shown in FIG. 6 is a chopper-stabilized operational amplifier where the circuit unit from the output stage of the differential amplifier Gm1 to the input stage of the summing elements 108-1, 108-2 in the operational amplifier 100 of the first embodiment shown in FIG. 1 is replaced by a high-pass filter 109, a non-inverting differential amplifier Gm20, and a chopper 101-8.

In other words, in FIG. 6, the output nodes (non-inverting and inverting output terminals) of the differential amplifier Gm1 are connected to the input nodes (non-inverting and inverting input terminals) of the non-inverting differential amplifier Gm20 via the high-pass filter 109. The high-pass filter 109 includes a capacitive element $C_{20a}$ and a resistance $R_{20a}$ as well as a capacitive element $C_{20b}$ and a resistance $R_{20b}$. In addition, the output nodes of the differential amplifier Gm5 are connected to the output nodes of the differential amplifier Gm1 via the phase-compensating capacitive elements $C_{c2a}$, $C_{c2b}$ and the chopper 101-8.

According to the operational amplifier 600 of this embodiment, with its three-stage differential amplifiers and phase-compensating signal paths, the operation equivalent to that performed by the operational amplifier 100 of the first embodiment including four-stage differential amplifiers and phase-compensating signal paths can be carried out.

Here, it is also possible to configure an operational amplifier corresponding to the operational amplifier 500 of the second embodiment by assuming a signal path equivalent to a circuit unit 601 enclosed by the dashed line in FIG. 6 as the signal paths 151a and 151b in the second embodiment shown in FIG. 5.

Note that the present invention is not limited to the embodiments and their variations described above. For example, although the first signal processing path 106 shown in FIG. 1 has a three-stage configuration having three circuit unit sets connected in series, where one circuit unit set is constituted by one high-pass filter and one differential amplifier to amplify output signals from the high-pass filter, it may be configured by at least one set. In addition, the configuration of the embodiments including the three-stage or four-stage MOS devices may be configured by bipolar devices. Of course, the class-AB amplifiers 501, 502 can be configured by bipolar transistors. Moreover, the chopper 101-1 in the first stage can be replaced by a frequency modulator.

What is claimed is:

1. An operational amplifier comprising:
   a first chopper for modulating an input signal pair;
   a first signal processing path on a stage subsequent to the first chopper, having at least one circuit unit set or multiple circuit unit sets connected in series, the circuit unit set being constituted by one high-pass filter and one differential amplifier to amplify output signals from the high-pass filter, wherein output nodes of the high-pass filter of each set are biased to a potential within a common-mode range that enables operation of the differential amplifier of that circuit unit set;
   a second chopper for signal demodulation provided on the output side of the first signal processing path;
   a second signal processing path including one differential amplifier connected to the output nodes of the first chopper;
   a summing means for summing an output signal from the first signal processing path and an output signal from the second signal processing path; and
   an amplifier that amplifies the signal generated by the summing means and supplied via the second chopper and outputs the amplified signal as an output signal of the operational amplifier.

2. The operational amplifier according to claim 1, comprising:
   a first phase-compensating signal path to provide feedback from a first node to a second node in a signal path from the output nodes of the differential amplifier of the first circuit unit set, that receive signals output from the first chopper as input signals, in the first signal processing path to the second chopper,
   wherein the first phase-compensating signal path includes:
   a first phase-compensating capacitive element;
   a third chopper for signal demodulation connected between the first node at a feedback source and one node of the first phase-compensating capacitive element; and
   a fourth chopper for signal modulation connected between the other node of the first phase-compensating capacitive element and the second node at a feedback destination.

3. The operational amplifier according to claim 2, comprising:
   a second phase-compensating signal path to provide feedback from a node at a feedback source after the second chopper to a node at a feedback destination in the first signal processing path,
   wherein the second phase-compensating signal path includes:
   a second phase-compensating capacitive element with one node being connected to the node at the feedback source; and
   a fifth chopper for signal modulation connected between the other node of the second phase-compensating capacitive element and the node at the feedback destination.

4. The operational amplifier according to claim 1, wherein the first signal processing path is constituted by multiple circuit unit sets, and wherein at a frequency corresponding to the second highest cutoff frequency among cutoff frequencies of the respective high-pass filters each included in the multiple circuit unit sets, gain of the second signal processing path is set equal to or higher than gain of the first signal processing path.

5. The operational amplifier according to claim 1, wherein the differential amplifier constituting the second signal processing path is provided with a high-pass filter on the input side.

6. The operational amplifier according to claim 1, comprising:
   third and fourth signal processing paths each equivalent to a circuit unit comprising the first signal processing path, the second signal processing path including one differential amplifier connected to the output nodes of the first chopper, and the summing means for summing the output signal from the first signal processing path and the output signal from the second signal processing path;
   a class-AB amplifier for inverted output and a class-AB amplifier for non-inverted output, each being constituted by a push-pull configuration with a first conduction type transistor and a second conduction type transistor; and
   a switch means to provide non-inverted signals output from the third and fourth signal processing paths to the first and second conduction type transistors of the class-AB amplifier for inverted output, respectively, and to provide inverted signals output from the third and fourth signal processing paths to the first and second conduction type transistors of the class-AB amplifier for non-inverted output, respectively.

* * * * *